(12) United States Patent
Tsukada

(10) Patent No.: US 7,224,186 B2
(45) Date of Patent: May 29, 2007

(54) SEMICONDUCTOR CIRCUIT DEVICE

(75) Inventor: Shuichi Tsukada, Tokyo (JP)

(73) Assignee: Elpida Memory Inc., Chuo-ku, Tokyo (JP)

( * ) Notice: Subject to any disclaimer, the term of this patent is extended or adjusted under 35 U.S.C. 154(b) by 143 days.

(21) Appl. No.: 11/060,391

(22) Filed: Feb. 17, 2005

(65) Prior Publication Data
US 2005/0184759 A1    Aug. 25, 2005

(30) Foreign Application Priority Data
Feb. 19, 2004  (JP) ............................. 2004-043300

(51) Int. Cl.
*H03K 19/0175*  (2006.01)
(52) U.S. Cl. .............................. 326/83; 326/68; 326/81
(58) Field of Classification Search ................... 326/63, 326/68, 80–83, 86
See application file for complete search history.

(56) References Cited

U.S. PATENT DOCUMENTS

| | | | | |
|---|---|---|---|---|
| 5,073,726 A | * | 12/1991 | Kato et al. ..................... | 326/24 |
| 5,200,921 A | * | 4/1993 | Okajima ................. | 365/189.11 |
| 5,541,885 A | * | 7/1996 | Takashima ................... | 365/226 |
| 5,973,533 A | * | 10/1999 | Nagaoka ....................... | 327/263 |
| 6,756,814 B2 | * | 6/2004 | Saitou et al. ................. | 326/81 |
| 6,850,094 B2 | * | 2/2005 | Yamaguchi ................. | 326/121 |

FOREIGN PATENT DOCUMENTS

| | | |
|---|---|---|
| JP | 56-131232 | 10/1981 |
| JP | 2-7466 | 1/1990 |
| JP | 02-140971 | 5/1990 |
| JP | 03-125515 | 5/1991 |
| JP | 04-085868 | 3/1992 |
| JP | 04-340810 | 11/1992 |
| JP | 05-315555 | 11/1993 |
| JP | 06-208790 | 7/1994 |
| JP | 07-121276 | 5/1995 |
| JP | 7-307661 | 11/1995 |
| JP | 2002-533930 | 10/2002 |

OTHER PUBLICATIONS

Japanese Office Action dated Oct. 4, 2006 with a partial English translation.

* cited by examiner

*Primary Examiner*—Don Le
(74) *Attorney, Agent, or Firm*—McGinn IP Law Group, PLLC

(57) ABSTRACT

The present invention relates to a semiconductor circuit device including a logic circuit and a signal line driving circuit. The logic circuit is operated at high supply voltage and outputs a signal with a high voltage amplitude. The signal line driving circuit receives a lower supply voltage and has a low-threshold transistor. With the above configuration, a signal can be transmitted at a high speed with a low voltage amplitude and low power consumption. Thus, the semiconductor circuit device including the signal line driving circuit can reduce operating current and can be operated with a low amplitude and low standby current at a high speed.

15 Claims, 8 Drawing Sheets

CIRCUIT BLOCK

SEMICONDUCTOR CIRCUIT DEVICE

This application claims priority to prior Japanese patent application JP 2004-43300, the disclosure of which is incorporated herein by reference.

BACKGROUND OF THE INVENTION

1. Field of the Invention

The present invention relates to semiconductor circuit devices with signal line driving circuits and, more particularly, to a semiconductor circuit device including signal line driving circuits for transferring a signal between circuit blocks with low power, low-voltage-swing, and low current consumption at high speed.

2. Description of the Related Art

Due to higher-density integration, larger-scale integration and higher speed of recent semiconductor circuit devices, an increase of operating current and resultant generation have caused serious problem to occur in each semiconductor circuit device. An important challenge is to reduce the operating current. One approach to the challenge is to lower an external supply voltage or an internal reduced supply voltage supplied to a semiconductor circuit device, thereby reducing operating current. Unfortunately, when a supply voltage is merely lowered, the working speed of a circuit is lowered.

A general semiconductor circuit device includes circuit blocks and signal lines for transmitting signals between the circuit blocks. FIG. 10 shows an example (first related art) of a conventional general semiconductor circuit device fabricated by CMOS process. Each circuit block comprises a logic circuit 20 and a signal line driving circuit 25. The logic circuit 20 performs a logic operation on a signal supplied from an input signal line 1 and generates an output signal to a node 2. The signal line driving circuit 25 functions as an inverter comprising an NMOS transistor QN10 and a PMOS transistor QP10. The signal line driving circuit 25 buffers a signal supplied from the node 2 and supplies the signal to an output signal line 10.

A positive potential VCC of a positive power supply VCC and a ground potential GND of a negative power supply GND are applied to each of the logic circuit 20 and the signal line driving circuit 25. The positive power supply VCC is an external power supply or an internal lower power supply. The output signal line 10 has a line capacitance CL. In the description of the present invention, for sake of simplicity, an explanation is made on the assumption that an input signal is supplied to each circuit block through one signal line, i.e., the input signal line 1 and an output signal is generated from the block through one signal line, i.e., the output signal line 10. In some cases, signals are supplied to each circuit block through a plurality of signal lines and are generated from the block through a plurality of signal lines. Generally, a logic threshold level of the logic circuit is set to the midpoint of the levels VCC and GND, i.e., ½×VCC.

Operating current in the circuit block according to the first related art of FIG. 10 is consumed by charging and discharging the capacitance at each node in the circuit block and the line capacitance CL. The potential of each node and that of the output signal line 10 swing between VCC and GND. When VCC is set to low voltage, therefore, the voltage swing in each node and the signal line is lowered, thus reducing the operating current. Disadvantageously, however, the low voltage VCC leads to a reduction in working speed of the circuit block. According to one of approaches for overcoming the disadvantage, a threshold voltage (VT) of each of NMOS and PMOS transistors of each circuit block is reduced, so that the reduction in working speed can be prevented. Unfortunately, when the threshold voltage of each transistor is reduced, OFF-state leakage current increases. This leads to an increase in standby current.

As patterns of semiconductor circuit devices are designed finer, the size of each circuit block tends to be smaller. On the other hand, the length of each signal line arranged between circuit blocks tends to be longer with increasing scale integration. Regarding the operating current in the circuit block of FIG. 10, therefore, the ratio of current consumed by charging and discharging the capacitance of each node in the circuit block becomes lower. Accordingly, current consumed by charging and discharging the line capacitance CL of the output signal line 10 accounts for most of the operating current. For this reason, a low-voltage-swing signal line driving method is proposed as disclosed in Japanese Unexamined Patent Publications (JP-A) Nos. 2-7466 and 7-307661. According to the method, only an output signal line is driven by a low voltage amplitude to reduce operating current and a circuit block is driven at high voltage to keep high working speed.

FIG. 11 shows a low-voltage-swing signal line driving circuit shown in FIG. 13 of Japanese Unexamined Patent Application Publication No. 7-307661 as a second related art. As distinct from the signal line driving circuit 25 in FIG. 10, in a signal line driving circuit 26, the source node of a PMOS transistor QP11 is connected to an internal power supply VL. The potential of the internal power supply VL is lower than the level VCC. A high logic level of an output signal line 11 is VL. Accordingly, the range of voltage swing of a signal line is up to the level VL that is low. Thus, operating current consumed by charging and discharging the line capacitance CL can be reduced. Similar to the circuit block in FIG. 10, the potential VCC is applied to the logic circuit 20. Therefore, a reduction in operation speed does not occur in the logic circuit 20.

According to the above-mentioned technique of driving only an output signal line with low-voltage-swing, as shown in a third related art in FIG. 12, a level converting circuit is added to an input portion of a circuit block. A low logic level of the input signal line 1 is GND and a high logic level thereof is VL. Since the level converting circuit is arranged, the range of the logic level of the input signal line 1 is increased between GND and VCC and, after that, a signal is input to the logic circuit 20. Generally, a logic threshold of the level converting circuit is set to the midpoint of the voltage swing of the corresponding signal line, i.e., ½×VL.

According to the second related art related to the low-voltage-swing signal line driving method of FIG. 11, disadvantageously, when the output signal line 11 changes from a low level to a high level, driving speed remarkably becomes slow. FIG. 13 is a timing chart showing the operations of the circuit blocks in FIGS. 10 and 11. The output-signal lines 10 and 11 represent the operations of the output signal lines of FIGS. 10 and 11, respectively. When the node 2 changes from the high level to the low level at time T1, the output signal lines 10 and 11 change from the level GND to the levels VCC and VL which are high logic levels, respectively. Time TA represents timing at which the voltage of the output signal line 10 reaches a logic threshold of a circuit which receives a signal from the output signal line 10, i.e., ½×VCC. Time TB indicates timing at which the voltage of the output signal line 11 reaches a logic threshold of a circuit which receives a signal from the output signal line 11, i.e., ½×VL. Therefore, the difference (TA−T1) and that (TB−T1) represent signal transfer delays. Time TB is delayed longer than time TA. This means a reduction in operating speed of the semiconductor circuit device.

The reason is as follows. In the circuit block of FIG. 10, the source node of the PMOS transistor QP10 is connected to the power supply VCC. When the PMOS transistor QP10 turns on, therefore, the gate of the PMOS transistor QP10 is in the level GND and the difference in potential (VGS) between the gate and the source thereof is in the level VCC. On the other hand, in the circuit block of FIG. 11, the potential difference VGS of the PMOS transistor QP11 is in the level VL that is low. Consequently, the ON-state current of the PMOS transistor QP11 is low. It takes much time to charge the line capacitance CL of the output signal line 11.

On the other hand, when the node 2 changes from the low level to the high level at time T2, the output signal lines 10 and 11 change from the levels VCC and VL to the level GND, respectively. At that time, in both of the circuit blocks of FIGS. 10 and 11, the potential difference VGS of each of the NMOS transistor QN10 and an NMOS transistor QN11 becomes the level VCC. The ON-state current of the NMOS transistor QN10 is equivalent to that of the NMOS transistor QN11. As shown at time TC, signal transfer speed in FIG. 10 is substantially the same as that in FIG. 11.

FIG. 14 shows a circuit according to a fourth related art. According to the fourth related art, when the output signal line 13 goes from the low logic level to the high logic level, a potential difference VGS of the PMOS transistor QP12 is increased to reduce a delay in signal transfer speed. FIG. 15 is a timing chart showing the operation in the circuit block of FIG. 14.

The circuit block in FIG. 14 will now be described. The structure of the logic circuit 20 is the same as that in FIG. 11. A signal line driving circuit 28 includes an NMOS transistor QN12, a PMOS transistor QP12, a delay circuit DELAY1, a PMOS transistor QP13, an inverter circuit INV2, and a PMOS transistor QP14. The gate of the NMOS transistor QN12 is connected to the node 2, the source is connected to the ground GND, and the drain is connected to an output signal line 13. The gate of the PMOS transistor QP12 is connected to the node 2, the source is connected to a node 15, and the drain is connected to the output signal line 13. The delay circuit DELAY1 receives an input from the node 2 and generates an output to a node 2D. The gate of the PMOS transistor QP13 is connected to the node 2D, the source is connected to the internal power supply VL, and the drain is connected to the node 15. An inverter circuit INV2 receives an input from the node 2D and generates an output to a node 14. The gate of the PMOS transistor QP14 is connected to the node 14, the source is connected to the power supply VCC, and the drain is connected to the node 15. The potential VCC is applied from a power supply (not shown) to each of the delay circuit DELAY1 and the inverter circuit INV2. Accordingly, a high logic level at each of the node 2D and the node 14 is VCC.

The operation of this circuit will now be described with reference to FIG. 15. The node 2 is in the high level for a period before T1. For this period, the node 2D is in the high level and the node 14 is in the low level. Consequently, the PMOS transistor QP13 is in the OFF state, the PMOS transistor QP14 is in the ON state, and the node 15 is in the level VCC.

At time T1, the node 2 goes from the high logic level to the low logic level. At time T1D that is delayed from time T1 by the amount of delay time of the delay circuit DELAY1, the node 2D goes from the high level to the low level and the node 14 changes from the low level to the high level. For a period from T1 to T1D, since the PMOS transistor QP13 is in the OFF state and the PMOS transistor QP14 is in the ON state, the potential VCC is applied to the node 15. In addition, the NMOS transistor QN12 turns off and the PMOS transistor QP12 turns on. The potential difference VGS of the PMOS transistor QP12 goes to substantially the level VCC. Thus, the PMOS transistor QP12 has high ON-state current. Consequently, the output signal line 13 rapidly changes from the level GND to the high logic level.

After time T1D, since the PMOS transistor QP13 turns on and the PMOS transistor QP14 turns off, the potential VL is applied to the node 15, so that the output signal line 13 goes to the level VL. Time T1D, i.e., the delay time of the delay circuit DELAY1 is set to time elapsed until the output signal line 13 goes to the level VL.

At time T2, the node 2 changes from the low logic level to the high logic level. At that time, the NMOS transistor QN12 turns on and the PMOS transistor QP12 turns off. Since the potential difference VGS of the NMOS transistor QN12 goes to the level VCC, the NMOS transistor QN12 has high ON-state current, so that the output signal line 13 rapidly changes from the level VL to the level GND.

At time T2D that is delayed from time T2 by the delay time of the delay circuit DELAY1, the node 2D changes from the low level to the high level and the node 14 goes from the high level to the low level. Consequently, the PMOS transistor QP13 turns off and the PMOS transistor QP14 turns on, so that the node 15 goes to the level VCC.

As mentioned above, when the circuit block in FIG. 14 is used, the output signal line can be changed from the level GND to the level VL at higher speed than that of the circuit block in FIG. 11. However, there are the following disadvantages.

First, it is necessary to set the potential difference VGS of the PMOS transistor QP12 to a large value so that the signal line rapidly changes from the level GND to the high logic level for a period from T1 to T1D. Therefore, the node 15 has to be held in a high level close to the level VCC. For this purpose, the capacity of the ON-state current of the PMOS transistor QP14 has to be higher than that of the PMOS transistor QP12. This means that the size of the PMOS transistor QP14 is larger than that of the PMOS transistor QP12. This leads to high operating current in charging and discharging the gate capacitance of the PMOS transistor QP14. Although the low-voltage-swing on the signal line is originally achieved to reduce operating current, disadvantageously, the effect of the low-voltage-swing is reduced.

Second, it is difficult to set the delay time of the delay circuit DELAY1. Particularly, due to a variation in transistor process or a change in temperature, the delay time of the delay circuit DELAY1 and the ON-state current of the PMOS transistor QP12 vary. In the case where the signal line changes from the level GND to the high logic level, it is impossible to precisely set the delay time of the delay circuit DELAY1 on any variable condition at timing when the signal line goes to the level VL. Depending on a variation in transistor process or a change in temperature, an error may be included in the level VL for the signal line.

Third, if the error occurs in the signal line level VL at time T1D, it is necessary to set the output signal line 13 to the level VL as soon as possible after time T1D. For this purpose, the size of the PMOS transistor QP13 has to be increased. This leads to an increase in gate capacitance of the PMOS transistor QP-13. Disadvantageously, the operating current is increased to charge and discharge the increased gate capacitance.

SUMMARY OF THE INVENTION

To overcome the above disadvantages of the related arts, it is an object of the present invention to provide a semiconductor circuit device including a signal line driving circuit for transferring data between circuit blocks with low standby current and low operating current at high speed.

According to a first aspect of the present invention, there is provided a semiconductor circuit device comprising a logic circuit for producing a logical output signal and a driving circuit for driving a signal line in response to the logical output signal, the logic circuit being given a first positive voltage and a first negative voltage and including a first logic transistor of a first conductive type and a second logic transistor of a second conductive type inverse to the first conductive type and connected to the first logic transistor to produce the logical output signal from a point of connection between the first and the second logic transistors; the driving circuit comprising a first driving transistor of the first conductive type for defining a first logic level and a second driving transistor of the second conductive type for defining a second logic level; at least one of the first and the second driving transistors being given an electric voltage different from at least one of the first positive and the first negative voltages; the at least one of the first and the second driving transistors having a threshold level different from that of the same conductive type selected from the first and the second logic transistors.

According to a second aspect of the present invention, there is provided a semiconductor circuit device wherein the first logic transistor is formed by a PMOS transistor supplied with the first positive voltage (Vcc) while the second logic transistor is formed by an NMOS transistor given a ground potential as the first negative voltage; the first driving transistor being selected as the at least one of the first and the second driving transistors and formed by a PMOS transistor which is supplied with the electric voltage lower than the first positive voltage (Vcc) and which has the threshold level smaller than that of the PMOS transistor in the logic circuit.

According to a third aspect of the present invention, there is provided a semiconductor circuit device wherein the first logic transistor is formed by a PMOS transistor supplied with the first positive voltage (Vcc) while the second logic transistor is formed by an NMOS transistor given a ground potential as the first negative voltage; the second driving transistor being selected as the at least one of the first and the second driving transistors and formed by an NMOS transistor which is supplied with the electric voltage different from the ground potential.

According to a fourth aspect of the present invention, there is provide a semiconductor circuit device wherein the first logic transistor is formed by a PMOS transistor supplied with the first positive voltage (Vcc) while the second logic transistor is formed by an NMOS transistor given a ground potential as the first negative voltage; both the first and the second driving transistors being selected as the at least one of the first and the second driving transistors and formed by a PMOS transistor and an NMOS transistor, respectively; the PMOS and the NMOS transistors being given as the electric voltage with source voltages different from the first positive voltage and the first negative voltage, respectively, and having threshold levels different from those of the first and the second logic transistors, respectively.

According to a fifth aspect of the present invention, there is provide a semiconductor circuit device comprising a logic circuit which is supplied with a first potential from a positive power supply and with a ground potential from a negative power supply; and a signal line driving circuit that is supplied from a positive power supply with a second potential lower than the first potential and with a ground potential from a negative power supply. The signal line driving circuit includes a PMOS transistor which has a threshold level (represented by an absolute value) lower than that of a PMOS transistor included in the logic circuit and; an NMOS transistor which has a normal threshold level equivalent with that of an NMOS transistor included in the logic circuit; the signal line driving circuit buffering an output signal of the logic circuit to send it to a signal line.

According to a sixth aspect of the present invention, there is provide a semiconductor circuit device wherein a potential difference between the first potential and the second potential is determined in relation to a threshold difference between the normal threshold level and the lower threshold level and falls within a range from one to ten times of the threshold difference.

According to a seventh aspect of the present invention, there is provide a semiconductor circuit device comprising a logic circuit which is supplied with a first potential from a positive power supply and a ground potential from a negative power supply; and a signal line driving circuit that is supplied from a positive power supply with the first potential and from a negative power supply with a second potential higher than the ground potential. The signal line driving circuit includes an NMOS transistor which has a threshold level lower than that of an NMOS transistor included in the logic circuit; and a PMOS transistor which has a normal threshold level equivalent with that of a PMOS transistor included in the logic circuit; the signal line driving circuit buffering an output signal of the logic circuit to send it to a signal line.

According to an eighth aspect of the present invention, there is provide a semiconductor circuit device wherein a potential difference between the ground potential and the second potential is determined in relation to a threshold difference between the normal threshold level and the lower threshold level and falls within a range from one to ten times of the threshold potential difference.

According to a ninth aspect of the present invention, there is provide a semiconductor circuit device comprising a logic circuit which is supplied with a first potential from a positive power supply and a ground potential from a negative power supply; and a signal line driving circuit that is supplied from a positive power supply with a second potential lower than the first potential and from a negative power supply with a third potential higher than the ground potential. The signal line driving circuit includes a PMOS transistor which has a threshold level (represented by an absolute value) lower than that of a PMOS transistor included in the logic circuit; and an NMOS transistor which has a threshold level lower than that of an NMOS transistor included in the logic circuit; the signal line driving circuit buffering an output signal of the logic circuit to send it to a signal line.

According to a tenth aspect of the present invention, there is provide a semiconductor circuit device wherein a potential difference between the first potential and the second electric potential is determined in relation to a threshold difference between the normal threshold level and the lower threshold level and falls within a range from one to ten times of the threshold potential difference.

According to an eleventh aspect of the present invention, there is provide a semiconductor circuit device wherein a potential difference between the ground potential and the third potential is determined in relation to a threshold difference between the normal threshold level and the lower threshold level and falls within a range from one to ten times of the threshold difference.

According to a twelfth aspect of the present invention, there is provide a semiconductor circuit device comprising a logic circuit which is supplied with a first potential from a positive power supply and a ground potential from a negative power supply; and a signal line driving circuit that is supplied from a first positive supply with the first potential and from a second positive supply with a second potential lower than the first potential. The signal line driving circuit comprises a first switch element arranged between the first power supply and a first node; a second switch element arranged between the second power supply and the first node, the first and the second switch elements being complementarily turned on or off; a capacitor connected to the first node; a PMOS transistor between the first node and a signal line; and an NMOS transistor between the signal line and the ground potential; the first switch element being turned off while the second switch element is turned on when the PMOS transistor is kept in an on-state and the NMOS transistor is kept in an off-state; the first switch element being turned on while the second switch element is turned off when the PMOS transistor is kept in an off-state and the NMOS transistor is kept in an on-state.

According to a thirteenth aspect of the present invention, there is provide a semiconductor circuit device wherein the capacitor has a capacitance determined by multiplying a line capacitance value on the signal line by a value obtained by dividing the second potential by a potential difference between the first and the second electric potentials.

A first advantage of the present invention is to drive a signal line of a signal line driving circuit in a semiconductor circuit device with low-voltage-swing at high speed. The reason is that the signal line driving circuit includes a low-threshold transistor. Thus, OFF-state current is sufficiently low and ON-state current is sufficiently high.

A second advantage of the present invention is to lower standby current in the signal line driving circuit. The reason is that the potential difference VGS of the low-threshold transistor in the signal line driving circuit is set to negative potential. Thus, OFF-state leakage current can be reduced.

A third advantage of the present invention is to drive the signal line of the signal line driving circuit with low operating current. The reason is that the size of a transistor to control the source node of a transistor driving the signal line can be sufficiently reduced. Thus, current required to control the control transistor can be kept low.

DESCRIPTION OF THE PREFERRED EMBODIMENTS

Figure 1:
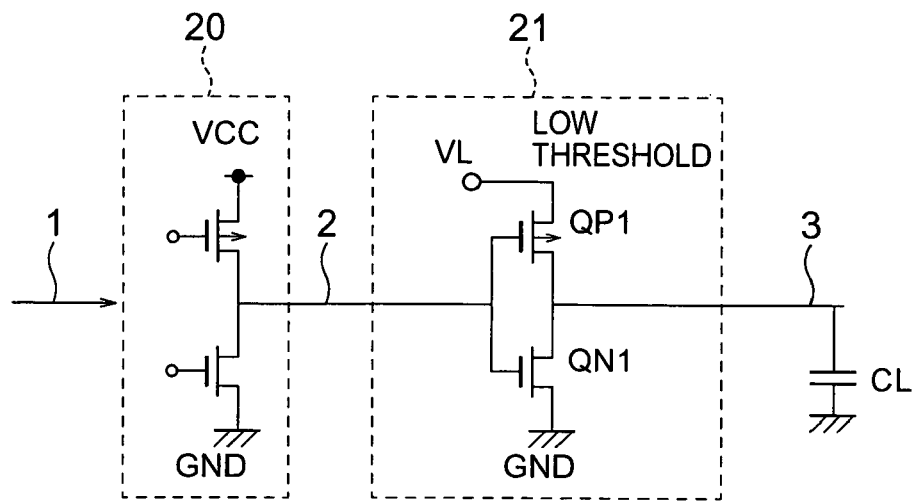
FIG. 1 is a circuit diagram according to a first embodiment of the present invention.

Embodiments of the present invention will now be described in detail below with reference to the drawings.
First Embodiment
FIG. 1 shows a circuit block according to a first embodiment of the present invention. The circuit block includes a CMOS circuit including a logic circuit 20 and a signal line driving circuit 21. The logic circuit 20 is arranged between a power supply VCC and ground GND. The logic circuit 20 is a CMOS logic circuit including normal-threshold transistors. The logic circuit 20 performs a logic operation on a signal supplied from an input signal line 1 and generates an output signal in a high level VCC or a low level GND to a node 2.

The signal line driving circuit 21 is a CMOS inverter including an NMOS transistor QN1 and a PMOS transistor QP1. The source of the NMOS transistor QN1 is connected to the ground as a negative power supply, the gate is connected to the node 2, and the drain is connected to an output signal line 3. The source of the PMOS transistor QP1 is connected to an internal power supply VL as a positive power supply, the gate is connected to the node 2, and the drain is connected to the output signal line 3. The signal line driving circuit 21 buffers a signal supplied from the node 2 and then outputs the signal to the output signal line 3. The potential of the internal power supply VL is lower than that of the power supply VCC and is higher than the ground potential GND. The NMOS transistor QN1 defines a low output level. The PMOS transistor QP1 defines a high output level. Each transistor outputs a signal having the potential of the corresponding source.

Figure 11:
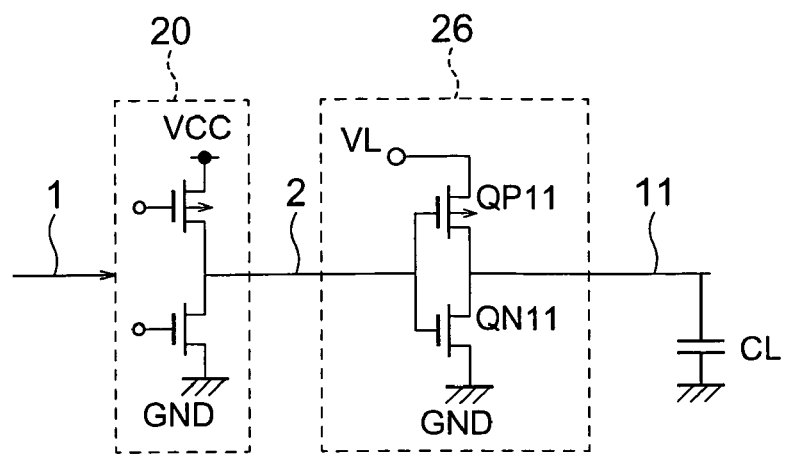
FIG. 11 is a circuit diagram according to a second related art.
Figure 12:
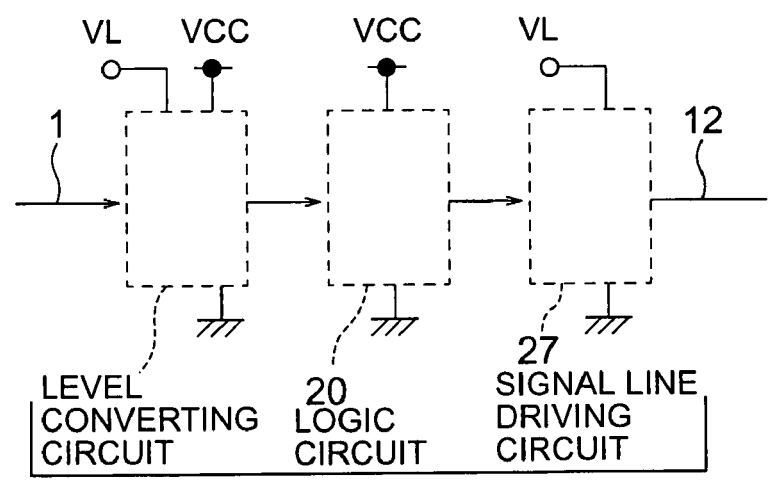
FIG. 12 is a circuit diagram according to a third related art.

The signal line driving circuit 21 includes the PMOS transistor QP1 having a threshold voltage (absolute value) lower than that of the PMOS transistor QP11 in FIG. 11. Accordingly, a high logic level of the output signal line 3 is VL and a low logic level thereof is GND. Thus, the signal line has a low-voltage-swing VL. In the following description, regarding a power supply of a CMOS circuit, in some cases, when the circuit has a high supply voltage, the power supply will be called a positive power supply and, when the circuit has a low supply voltage, the power supply will be called a negative power supply. In the first embodiment, the signal line driving circuit 21 has the positive power supply VL and the negative power supply GND. The logic circuit 20 has the positive power supply VCC and the negative power supply GND.

Figure 5:
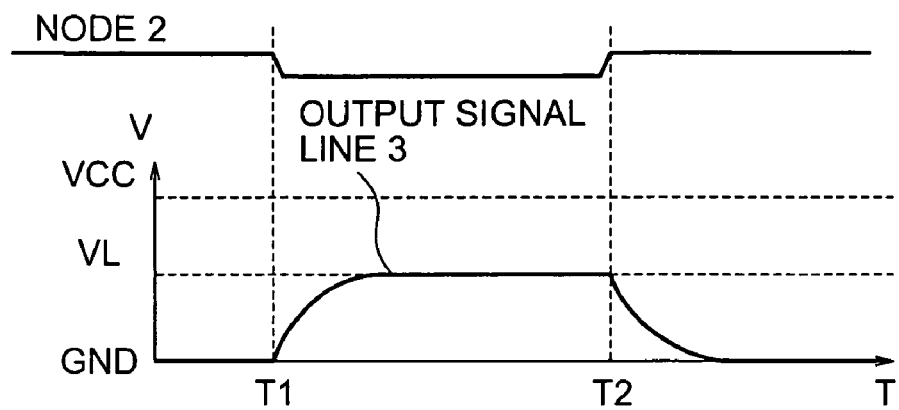
FIG. 5 is a timing chart of the operation according to the first embodiment.

FIG. 5 shows a timing chart according to the first embodiment. For a period before time T1, the node 2 is at a high logic level, the PMOS transistor QP1 is in the OFF state, and the NMOS transistor QN1 is in the ON state. Since the logic circuit 20 is connected to the positive power supply VCC, the node 2 is at the level VCC for this period. In addition, the potential of the internal power supply VL is lower than the potential VCC. Accordingly, the gate of the low-threshold PMOS transistor QP1 is at VCC and the source thereof is at VL. Thus, although the low-threshold PMOS transistor QP1 is used, OFF-state leakage current can be remarkably reduced.

Figure 13:
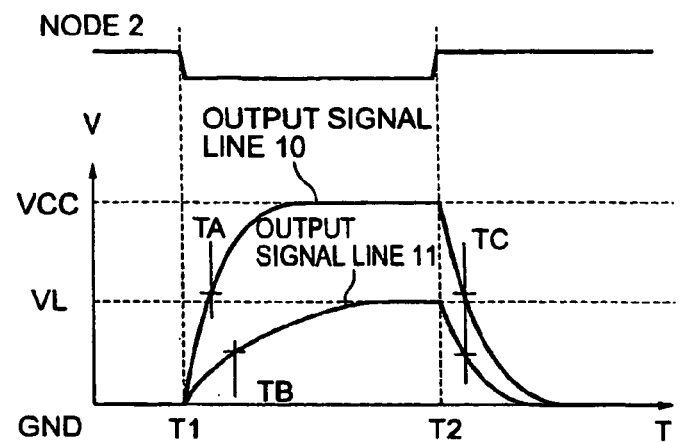
FIG. 13 is a timing chart showing the operations according to the first and second related arts.

Referring to FIG. 5, when the node 2 changes from the high logic level to a low logic level at time T1, the NMOS transistor QN1 in FIG. 1 turns off and the PMOS transistor QP1 turns on. The ON-state current of the low-threshold PMOS transistor QP1 is shown by IB2 in FIG. 9, i.e., it is high. The output signal line 3 rapidly changes from the level GND to the level VL. Thus, signal transfer speed is high. On the other hand, the conventional circuit in FIG. 11 includes the normal-threshold PMOS transistor QP11. The ON-state current of the PMOS transistor QP11 is shown by IA1 in FIG. 9, i.e., it is low. Consequently, the signal transfer speed of the output signal line 11 changing from the level GND to the level VL is lowered (refer to FIG. 13).

Referring to FIG. 5, at time T2, when the node 2 changes from the low logic level to the high logic level, the NMOS transistor QN1 in FIG. 1 turns on and the PMOS transistor QP1 turns off. Since the potential difference VGS of the NMOS transistor QN1 is in the level VCC, the NMOS transistor QN1 has sufficiently high ON-state current capacity. Thus, the signal transfer speed is high. According to the present embodiment, since the PMOS transistor QP1 serving as a low-threshold transistor is used, the high-speed driving circuit with low-voltage-swing can be achieved.

Figure 9:
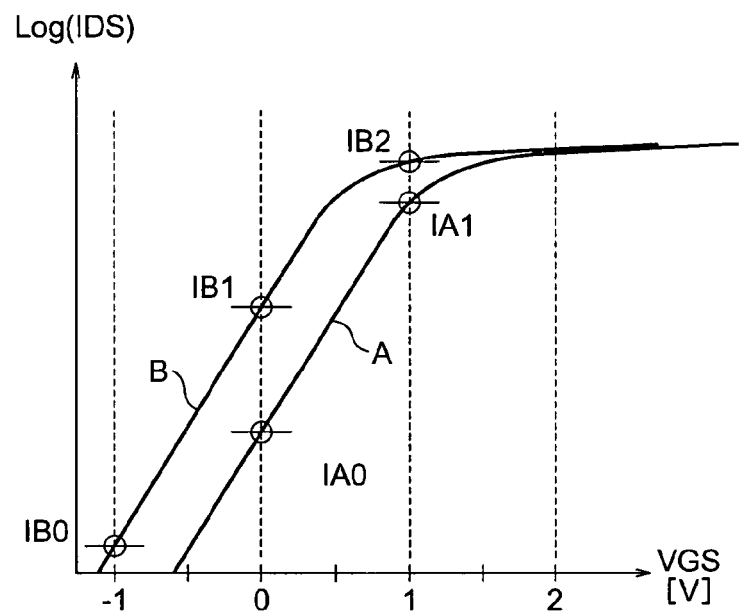
FIG. 9 is a graph showing the characteristics of MOS transistors.

OFF-state leakage currents in this circuit will now be explained. FIG. 9 is a graph showing the characteristics of MOS transistors. The abscissa represents the potential difference VGS between the gate level and the source level. In the case of a PMOS transistor, when the source level is lower than the gate level, the potential difference VGS is a negative value. In the case of an NMOS transistor, when the gate level is lower than the source level, the potential difference VGS is a negative value. The ordinate represents the logarithmic absolute value Log (IDS) of drain-source current. The curve A represents the characteristic of a normal-threshold MOS transistor. The curve B represents the characteristic of a low-threshold MOS transistor. In this example shown in FIG. 9, the threshold voltage of the low-threshold MOS transistor is lower than that of the normal-threshold MOS transistor by 0.5 V. As shown in FIG. 9, therefore, when the characteristic A of the normal-threshold transistor is shifted in parallel to the left by 0.5 V, the characteristic B of the low-threshold transistor is obtained. Normal threshold and low threshold are determined on the basis of the absolute values. For example, in the case of the threshold voltage of a PMOS transistor, a threshold voltage of −1.0 V is normal and a threshold voltage of −0.5 V is low.

Figure 10:
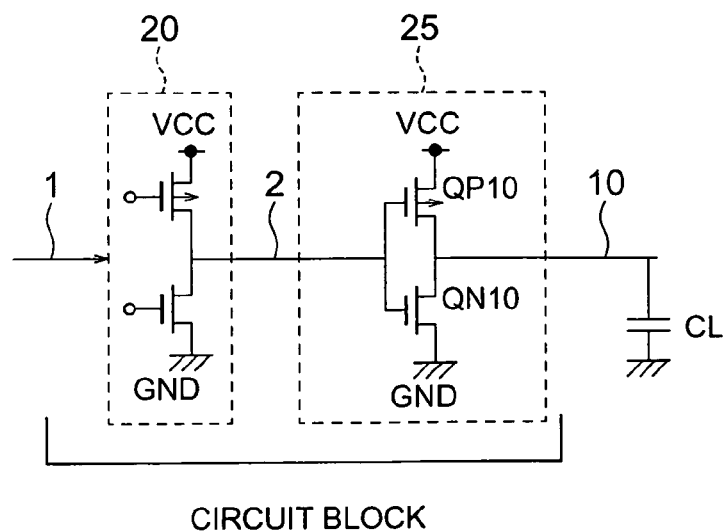
FIG. 10 is a circuit diagram according to a first related art.

The relationship between the supply voltage, the threshold voltage of a MOS transistor, and the leakage current thereof in the conventional circuit in FIG. 10 will now be described. Generally, supply voltage correlates with the threshold voltage of a MOS transistor. When a high supply voltage is used, a normal-threshold transistor is used. When a low supply voltage is used, a low-threshold transistor is used. A first case (supply voltage: 2.0 V, normal threshold) and a second case (supply voltage: 1.0 V, low threshold) will be explained on the assumption that the low threshold is lower than the normal threshold by 0.5 V.

In the first case, when the node 2 is in the high level, the gate voltage and the source voltage of the PMOS transistor QP10 indicate the supply voltage of 2.0 V. Thus, the potential difference VGS is equal to 0 V. Referring to FIG. 9, the OFF-state leakage current of the transistor is shown by IA0, i.e., the intersection of 0 V and the curve A of the normal-threshold transistor. When the node 2 is in the low level, the gate voltage and the source voltage of the NMOS transistor QN10 indicate the supply voltage of 0 V. The potential difference VGS is equal to 0 V. In FIG. 9, the OFF-state leakage current is shown by the intersection IA0 of 0 V and the curve A of the normal-threshold transistor. Regarding the high and low levels of the node 2, therefore, the OFF-state leakage currents are shown by IA0.

In the second case, when the node 2 is in the high level, the gate voltage and the source voltage of the PMOS transistor QP10 indicate the supply voltage of 1.0 V Thus, the potential difference VGS is equal to 0 V. Referring to FIG. 9, the OFF-state leakage current of the transistor is shown by IB1, i.e., the intersection of 0 V and the curve B of the low-threshold transistor. When the node 2 is in the low level, the gate voltage and the source voltage of the NMOS transistor QN10 indicate the supply voltage of 0 V. The potential difference VGS is equal to 0 V. In FIG. 9, the OFF-state leakage current is shown by the intersection IB1 of 0 V and the curve B of the low-threshold transistor. Regarding the second case, therefore, in both the levels of the node 2, the OFF-state leakage current is shown by IB1, i.e., high OFF-state leakage current flows. This OFF-state leakage current becomes a high standby current which flows when the circuit does not operate. It results in wasted power consumption.

On the other hand, according to the present embodiment shown in FIG. 1, when the supply voltage VCC=2.0 V, the supply voltage VL=1.0 V, and the node 2 is in the high level, the gate voltage of the low-threshold PMOS transistor QP1 is 2.0V and the source voltage thereof is 1.0 V. Thus, the potential difference VGS is equal to −1.0 V. The OFF-state leakage current thereof is shown by IB0, i.e., the intersection of −1.0 V and the curve B of the low-threshold transistor. When the OFF-state leakage currents of the first and second cases and the present embodiment are compared, therefore, IB1 (second case)>>IA0 (first case)>>IB0 (first embodiment). According to the present embodiment, the low-threshold transistor is used and the extremely low OFF-state leakage current is realized. When the node 2 is in the low level, the gate voltage and the source voltage of the normal-threshold NMOS transistor QN1 indicate 0 V and the potential difference VGS is equal to 0 V. The OFF-state leakage current thereof is shown by IA0 as the intersection of 0 V and the curve A of the normal-threshold transistor. Therefore, the level of the OFF-state leakage current is the same as that of the first case.

According to the present embodiment, the OFF-state leakage current of the PMOS transistor QP1 is lower than that of the normal-threshold transistor and the OFF-state leakage current of the NMOS transistor QN1 is equivalent to that of the normal-threshold transistor. Consequently, while the low-threshold PMOS transistor is used, the same or lower leakage current than that in the case using the normal-threshold transistors can be obtained.

According to the present embodiment, the supply voltage VCC is set to 2.0 V, the supply voltage VL is set to 1.0 V, and the PMOS transistor QP1 having a threshold voltage lower than the normal threshold by 0.5 V is used. From a standpoint of the relationship between the amount ΔVCC (=VCC−VL) of decrease in supply voltage and the amount ΔVT (=normal threshold−low threshold) of decrease in threshold voltage of the transistor, it is desirable to satisfy ΔVCC≧ΔVT to set the leakage current to the same or lower than that in the case of using the normal-threshold transistors, as will be obviously understood from FIG. 9. In terms of production process, it is preferable that the largest amount ΔVCC be limited to ten times larger than the amount ΔVT. Accordingly, it is preferable that the correlation therebetween be 10ΔVT≧ΔVCC≧ΔVT.

As mentioned above, according to the present embodiment, the CMOS logic circuit having normal supply voltage is used as the logic circuit, the supply voltage of the signal line driving circuit is lower than the normal supply voltage, and the low-threshold PMOS transistor is included in the signal line driving circuit. Thus, a semiconductor circuit device including the signal line driving circuit can have the effects of reducing operating current and realize low standby current and high signal transfer speed, in spite of the fact that a signal amplitude is small.

Second Embodiment

Figure 2:
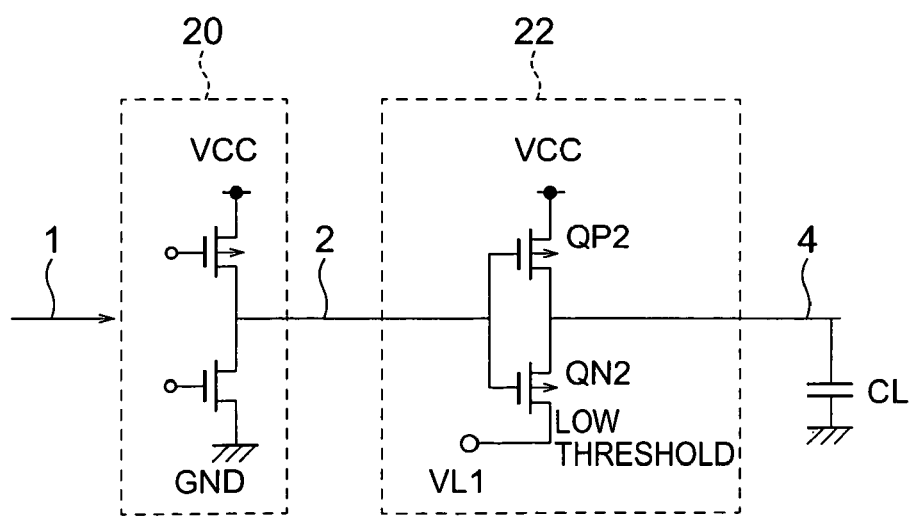
FIG. 2 is a circuit diagram according to a second embodiment of the present invention.
Figure 6:
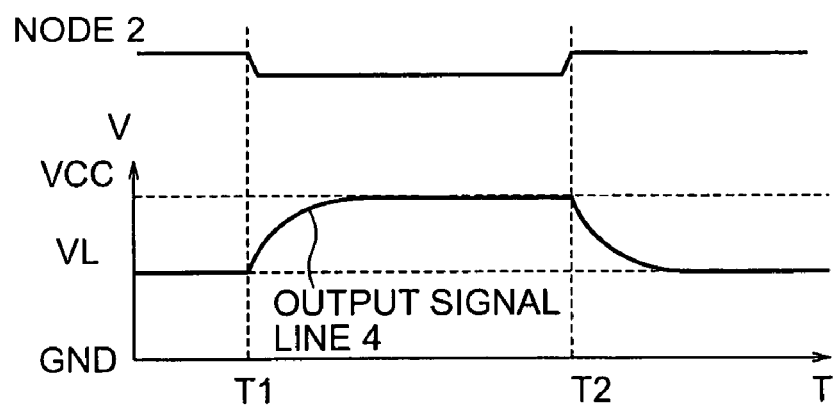
FIG. 6 is a timing chart of the operation according to the second embodiment.

FIG. 2 is a diagram of a circuit block according to a second embodiment of the present invention. FIG. 6 is a timing chart of the operation according to the second embodiment. A signal line driving circuit 22 according to the second embodiment is an inverter including an NMOS transistor QN2 and a PMOS transistor QP2. The source of the NMOS transistor QN2 is connected to an internal power supply VL1, the gate is connected to a node 2, and the drain is connected to an output signal line 4. The source of the PMOS transistor QP2 is connected to a power supply VCC, the gate is connected to the node 2, and the drain is connected to the output signal line 4. The signal line driving circuit 22 buffers a signal supplied from the node 2 and generates the signal to the output signal line 4. The NMOS transistor QN2 defines a low output level. The PMOS transistor QP2 defines a high output level. A logic circuit 20 is the same as that in FIG. 1. The potential of the internal power supply VL1 is higher than a ground potential GND and is lower than the potential of the power supply VCC. The NMOS transistor QN2 is a low-threshold transistor. A high logic level of the signal line 4 is VCC and a low logic level thereof is VL1. Accordingly, a signal which has a reduced amplitude appears on the signal line 14 and is represented by (VCC−VL1).

When the node 2 changes from a high logic level to a low logic level at time T1, the NMOS transistor QN2 turns off and the PMOS transistor QP2 turns on. At that time, the potential difference VGS of the PMOS transistor QP2 is VCC. Accordingly, the PMOS transistor QP2 has enough high ON-state current capacity, resulting in high signal transfer speed. For a period during which the node 2 is in the low logic level, the potential difference VGS of the NMOS transistor QN2 is (GND−VL1) that is negative. Consequently, OFF-state leakage current is very low, resulting in low standby current.

When the node 2 changes from the low logic level to the high logic level at time T2, the NMOS transistor QN2 turns on and the PMOS transistor QP2 turns off. At that time, the gate of the NMOS transistor QN2 is in the level VCC and the source thereof is in the level VL1. Thus, the potential difference VGS of the NMOS transistor QN2 is small. However, since the NMOS transistor QN2 has a low threshold voltage, enough high ON-state current sufficiently becomes large. Thus, the signal line 4 rapidly changes from VCC to VL1.

According to the present embodiment, from a standpoint of the relationship between the amount ΔGND (=VL1−GND) of change in negative supply voltage and the amount ΔVT (=normal threshold−low threshold) of change in threshold voltage of the transistor, as will be understood from FIG. 9, it is desirable to satisfy ΔGND≧ΔVT, thereby setting the leakage current to the same or lower level than that in the case of using normal-threshold transistors. In terms of production process, it is preferable that the largest amount ΔGND be limited to ten times larger than the amount ΔVT. Accordingly, it is preferable that the correlation therebetween be 10ΔVT≧ΔGND≧ΔVT.

As mentioned above, according to the present embodiment, the CMOS logic circuit having normal supply voltage is used as the logic circuit, the negative supply voltage of the signal line driving circuit is high, and the low-threshold NMOS transistor is included in the signal line driving circuit. This structure serves to lower a signal amplitude. Thus, a semiconductor circuit device including the signal line driving circuit can have the effects of reducing operating current and realize low standby current and high signal transfer speed.

Third Embodiment

Figure 3:
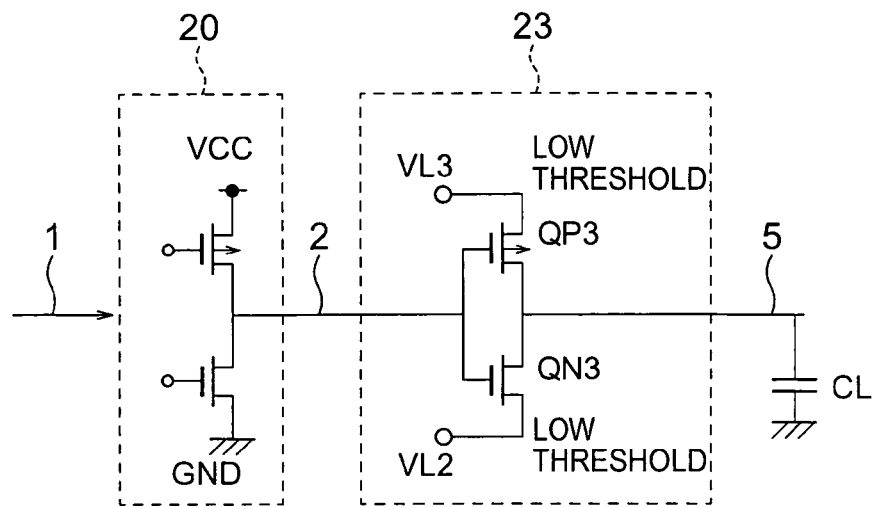
FIG. 3 is a circuit diagram according to a third embodiment of the present invention.
Figure 7:
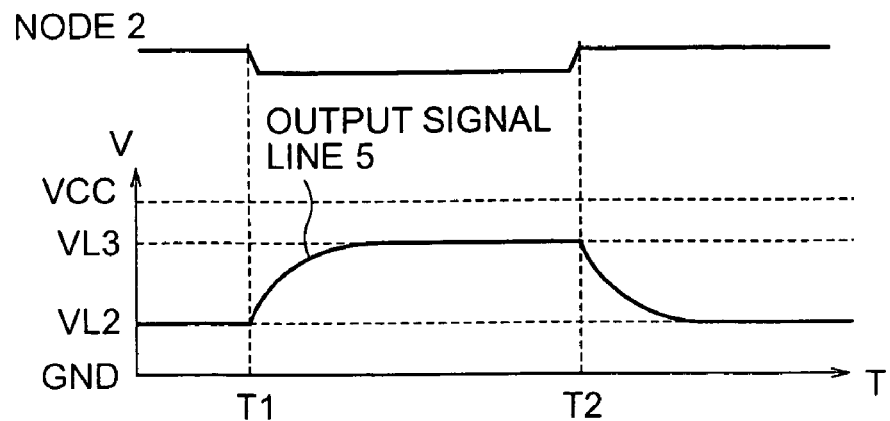
FIG. 7 is a timing chart of the operation according to the third embodiment.

FIG. 3 is a diagram of a circuit block according to a third embodiment of the present invention. FIG. 7 is a timing chart of the operation according to the third embodiment. The circuit block according to the third embodiment includes a logic circuit 20 and a signal line driving circuit 23. The signal line driving circuit 23 is an inverter including an NMOS transistor QN3 and a PMOS transistor QP3. The source of the NMOS transistor QN3 is connected to an internal power supply VL2, the gate is connected to a node 2, and the drain is connected to an output signal line 5. The source of the PMOS transistor QP3 is connected to an internal power supply VL3, the gate is connected to the node 2, and the drain is connected to the output signal line 5. The signal line driving circuit 23 buffers a signal supplied from the node 2 and generates the signal to the output signal line 5. The NMOS transistor QN3 defines a low output level and the PMOS transistor QP3 defines a high output level. The logic circuit 20 is the same as that in FIG. 1.

In the signal line driving circuit 23, the internal power supply VL3 is a positive power supply and the internal power supply VL2 is a negative power supply. In the following description, a power supply with a high potential will be referred to a positive power supply and a power supply with a low potential will be referred to a negative power supply. In this case, the potential VL3 is lower than a potential VCC and the potential VL2 is higher than a ground potential GND. The potential VL3 is higher than the potential VL2. Both of the NMOS transistor QN3 and the PMOS transistor QP3 are low-threshold transistors. A high logic level of the output signal line 5 is in the level VL3 and a low logic level thereof is in the level VL2. Thus, a low signal amplitude of (VL3−VL2) appears on the output signal line 5.

When the node 2 changes from a high logic level to a low logic level at time T1, the NMOS transistor QN3 turns off and the PMOS transistor QP3 turns on. At that time, the potential difference VGS of the PMOS transistor QP3 is VL3 that is small. Since the PMOS transistor QP3 has a low threshold, enough high ON-state current is obtained. Consequently, the output signal line 5 rapidly changes from VL2 to VL3. For a period during which the node 2 is in the low logic level, the potential difference VGS of the NMOS transistor QN3 is (GND−VL2) that is negative. The OFF-state leakage current is very low, resulting in low standby current.

When the node 2 changes from the low logic level to the high logic level at time T2, the PMOS transistor QP3 turns off and the NMOS transistor QN3 turns on. At that time, the gate of the NMOS transistor QN3 is in the level VCC and the source thereof is in the level VL2, so that the potential difference VGS thereof is (VCC−VL2) that is small. Since the NMOS transistor QN3 has a low threshold, enough high ON-state current is obtained. Consequently, the output signal line 5 rapidly changes from VL3 to VL2. For a period during which the node 2 is in the high logic level, the potential difference VGS of the PMOS transistor QP3 is (VL3−VCC) that is negative. Thus, the OFF-state leakage current is very low, resulting in low standby current.

According to the present embodiment, the amount of change in supply voltage is expressed by ΔVCC+ΔGND=(VCC−VL3)+|(GND−VL2)|. From a standpoint of the relationship between the amount of change in each supply voltage and the amount ΔVT (=normal threshold−low threshold) of change in threshold voltage of the transistor, it is desirable to satisfy ΔVCC≧ΔVT and ΔGND≧ΔVT, thereby setting the leakage current to the same level as that in the case of using normal-threshold transistors. Accordingly, it is desirable that the correlations therebetween be similar to those according to the first and second embodiments.

As mentioned above, according to the present embodiment, the CMOS logic circuit having normal supply voltage is used as the logic circuit, the positive supply voltage of the signal line driving circuit is low, the negative supply voltage thereof is high, and the low-threshold PMOS and NMOS transistors are included in the signal line driving circuit. This structure services to lower a signal amplitude. Thus, a semiconductor circuit device including the signal line driving circuit can have the effects of reducing operating current and realize low standby current and high signal transfer speed.

In the respective embodiments of the present invention, the signal line driving circuits in FIGS. 1 to 3 have been explained on the assumption that the structure of each signal driving circuit is similar to that of an inverter in which an input signal is supplied through the one node 2 and which comprises one NMOS transistor and one PMOS transistor. The present invention can also be applied to a signal line driving circuit with a NAND structure including a plurality of input signal lines, a plurality of NMOS transistors, and a plurality of PMOS transistors. In other words, if a positive power supply VL, of which potential is lower than VCC, is used in a signal line driving circuit as shown in FIG. 1, the signal line driving circuit includes a plurality of low-threshold PMOS transistors. In this case, the same advantages are also obtained.

Fourth Embodiment

Figure 4:
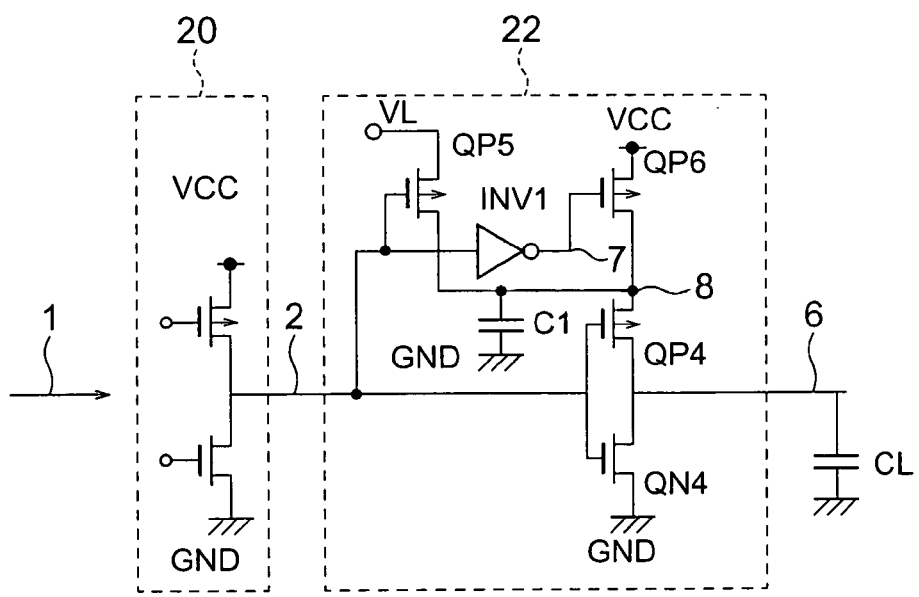
FIG. 4 is a circuit diagram according to a fourth embodiment of the present invention.
Figure 8:
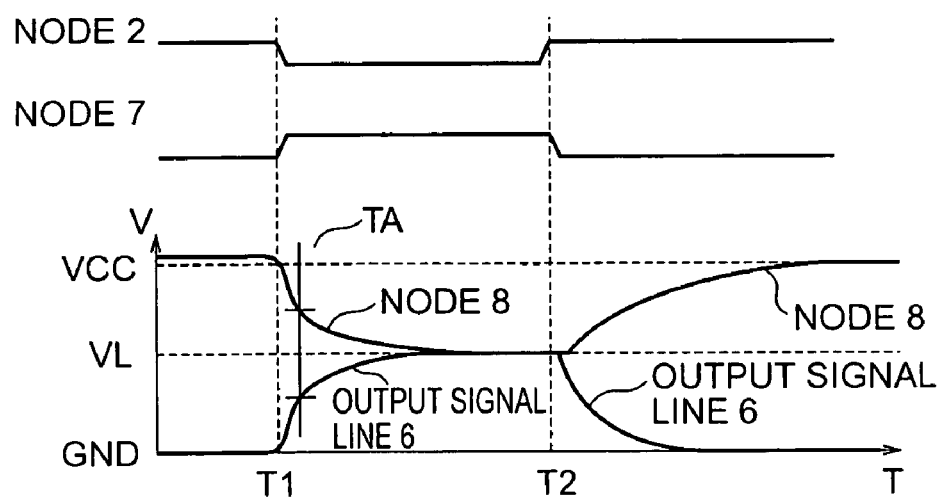
FIG. 8 is a timing chart of the operation according to the fourth embodiment.

FIG. 4 is a diagram of a circuit block according to a fourth embodiment of the present invention. FIG. 8 is a timing chart of the operation according to the fourth embodiment.

The circuit block of FIG. 4 will now be described. A logic circuit 20 is the same as that in FIG. 1. A signal line driving circuit 24 comprises an NMOS transistor QN4, a PMOS transistor QP4, a PMOS transistor QP5, an inverter circuit INV1, a PMOS transistor QP6, and a capacitor C1. The gate of the NMOS transistor QN4 is connected to a node 2, the source is connected to ground GND, and the drain is connected to an output signal line 6. The gate of the PMOS transistor QP4 is connected to the node 2, the source is connected to a node 8, and the drain is connected to the output signal line 6. The gate of the PMOS transistor QP5 is connected to the node 2, the source is connected to an internal power supply VL, and the drain is connected to the node 8. The inverter circuit INV1 receives a signal from the node 2 and generates a signal to a node 7. The gate of the PMOS transistor QP6 is connected to the node 7, the source is connected to a power supply VCC, and the drain is connected to the node 8. The capacitor C1 is arranged between the node 8 and ground GND. The potential of the internal power supply VL is lower than that of the power supply VCC and is higher than the ground potential.

The potential VCC is applied from a power supply (not shown) to the inverter circuit INV1. Accordingly, a high logic level of the node 7 is VCC. A high logic level of the output signal line 6 is VL and a low logic level thereof is GND, so that the output signal line 6 has a low voltage amplitude VL. The NMOS transistor QN4 defines a low output level. The PMOS transistor QP4 defines a high output level. Each of the PMOS transistors QP5 and QP6 is sufficiently small in size as compared with QP4 and has a low threshold level (absolute value) in comparison with QP4. The capacitance of the capacitor C1 is set so as to satisfy the following equation in accordance with a line capacitance CL and the potentials VCC and VL.

$$C1 = CL \times VL/(VCC - VL) \qquad (1)$$

The operation of the circuit block will now be described with reference to FIG. 8. For a period before time T1, the node 2 is in a high level. Accordingly, the node 7 is in a low level for this period. The PMOS transistor QP5 is in the OFF state and the PMOS transistor QP6 is in the ON state. The node 8 serving as one electrode of the capacitor C1 is charged in the level VCC.

The node 2 changes from the high logic level to the low logic level at time T1. At this time, therefore, the PMOS transistor QP5 turns on and the PMOS transistor QP6 turns off to apply the potential VL to the node 8. Since the size of the PMOS transistor QP5 is sufficiently small, the charges at the level VCC in the capacitor C1 are not rapidly changed to the level VL. On the other hand, the NMOS transistor QN4 turns off and the PMOS transistor QP4 turns on, so that the signal line 6 changes from the level GND to the high level. At that time, the charges at the level VCC in the capacitor C1 connected to the node 8 are supplied to the output signal line 6 through the PMOS transistor QP4.

Just after time T1, therefore, the node 8 is in a high level close to the level VCC. Accordingly, a high voltage in the vicinity of the level VCC is applied to the PMOS transistor QP4. Particularly, for a period until time TA when the level of the signal line reaches ½×VL as a logic threshold level of a circuit connected to the signal line, the potential level at the node 8, i.e., the level at the source of the PMOS transistor QP4 is sufficiently higher than VL. Consequently, the potential difference VGS of the PMOS transistor QP4 is large, resulting in a high ON-state current capacity. This allows the output signal line 6 to rapidly change from the level GND to the high logic level, thus resulting in high signal transfer speed.

Most of the charges in the capacitor C1 are supplied to the signal line after time TA. The level at the node 8 is lowered in the vicinity of the level VL. Consequently, the potential difference VGS of the PMOS transistor QP4 becomes small; thus reducing the rate of change to the high level in the signal line. Since the level of the signal line already exceeds the logic threshold level of the circuit connected to the signal line, the reduction in the rate of change in the level of the signal line does not cause a reduction in signal transfer speed. The capacitance of the capacitor C1 is represented by the equation (1). Accordingly, after a while, the levels of the signal line and the node 8 substantially become the level VL due to the charge redistribution between the capacitance C1 and the line capacitance CL. At that time, even if the level of the signal line is slightly different from the level VL, the node 8 and the output signal line 6 finally become the level VL because the PMOS transistor QP5 with a small size turns on and drives the node 8 at the level VL with low ON-state current capacity.

At time T2, the node 2 changes from the low logic level to the high logic level. At that time, the NMOS transistor QN4 turns on and the PMOS transistor QP4 turns off. Since the potential difference VGS of the NMOS transistor QN4 is VCC, high ON-state current is obtained. Thus, the signal line 6 rapidly changes from the level VL to the level GND. In addition, the PMOS transistor QP5 turns off and the PMOS transistor QP6 turns on, so that the node 8 goes to the level VCC. At that time, it is preferable to charge the node 8 at the level VCC until the node 2 goes to the low level at the next time. Thus, the size of the PMOS transistor QP6 can be reduced in accordance with the duty cycle or the like of the signal line.

Regarding the capacitor C1, so long as, e.g., the P well and the gate on a semiconductor substrate are used as electrodes and a gate oxide is formed as a dielectric, the capacitance of the capacitor C1 is less sensitive to transistor process variation and temperature fluctuation.

Figure 14:
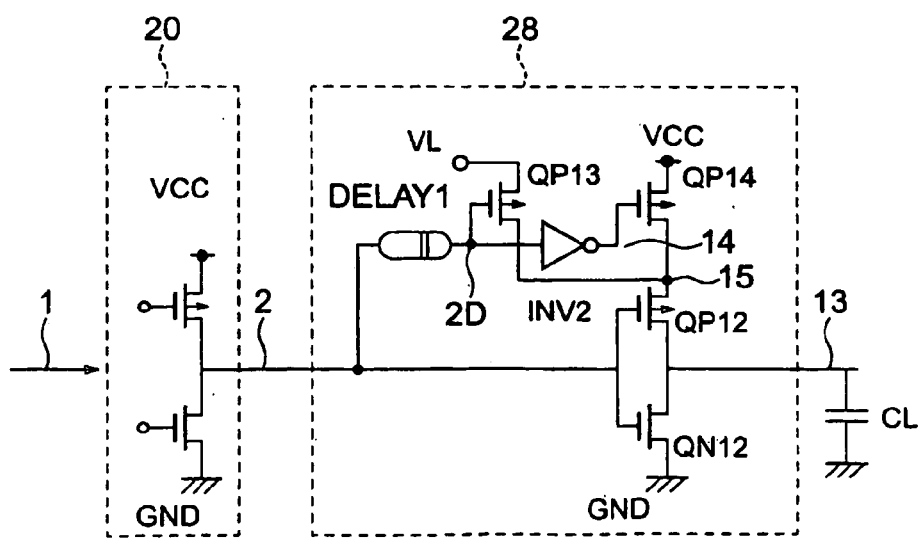
FIG. 14 is a circuit diagram according to a fourth related art.
Figure 15:
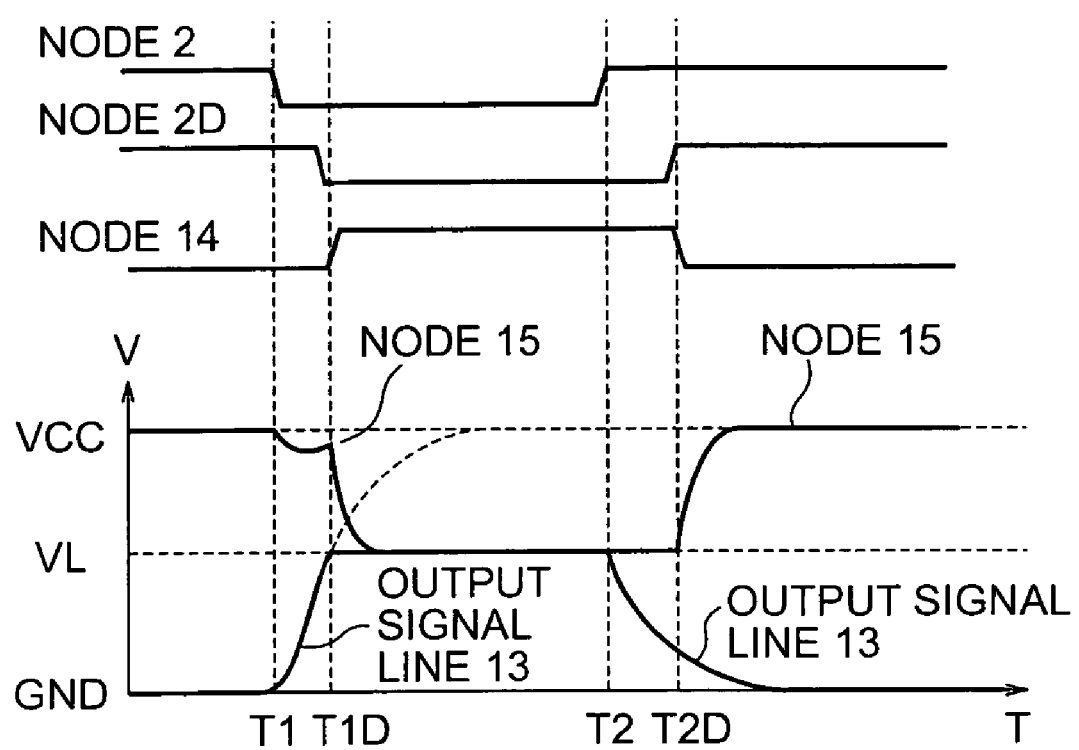
FIG. 15 is a timing chart of the operation according to the fourth related art.

The features of the circuit block in FIG. 4 will be compared to the general circuit block in FIG. 14. The circuit block in FIG. 14 requires increasing the size of each of the PMOS transistors QP13 and QP14. Charging and discharging the gate capacitance causes high operating current. In the circuit block in FIG. 4, the size of each of the PMOS transistors QP5 and QP6 can be sufficiently reduced. The gate capacitance can be charged and discharged with low operating current. In addition, in the circuit in FIG. 14, just after the signal line 13 goes to the high logic level, the signal line fluctuates from the level VL due to transistor process variation or temperature fluctuation. In the circuit block in FIG. 4, advantageously, just after the signal line 6 becomes the high logic level, the signal line is less sensitive to transistor process variation or temperature fluctuation.

As mentioned above, when a signal line driving circuit has a structure shown in FIG. 4, a low-voltage-swing signal is realized. Thus, a semiconductor circuit device including the signal line driving circuit can have the effects of reducing operating current and realize low standby current and high signal transfer speed.

The present invention has been specifically described based on the embodiments. It is obviously understood that the present invention is not limited to the embodiments but many modifications and variations are possible without departing from the spirit and scope of the invention.

What is claimed is:

1. A semiconductor circuit device comprising:
   a logic circuit for producing a logical output signal; and
   a driving circuit for driving a signal line in response to the logical output signal,
   wherein the logic circuit is given a first positive voltage and a first negative voltage and includes a first logic transistor of a first conductive type and a second logic transistor of a second conductive type inverse to the first conductive type and connected to the first logic transistor to produce the logical output signal from a point of connection between the first and the second logic transistors; and
   the driving circuit comprising:
   a first driving transistor of the first conductive type for defining a first logic level; and
   a second driving transistor of the second conductive type for defining a second logic level,
   wherein at least one of the first and the second driving transistors is given an electric voltage different from at least one of the first positive and the first negative voltages; and
   said at least one of the first and the second driving transistors has a threshold level different from that of a same conductive type transistor selected from the first and the second logic transistors,
   further wherein the first driving transistor is selected as the at least one of the first and the second driving transistors which is supplied with the electric voltage lower than the first positive voltage (Vcc) and which has the threshold level smaller than that of the first logic transistor in the logic circuit.

2. A semiconductor device as claimed in claim 1, wherein the first logic transistor comprises a PMOS transistor supplied with the first positive voltage (Vcc) and the second logic transistor comprises an NMOS transistor given a ground potential as the first negative voltage.

3. A semiconductor circuit device comprising:
   a logic circuit for producing a logical output signal; and
   a driving circuit for driving a signal line in response to the logical output signal,
   wherein the logic circuit is given a first positive voltage and a first negative voltage and includes a first logic transistor of a first conductive type and a second logic transistor of a second conductive type inverse to the first conductive type and connected to the first logic transistor to produce the logical output signal from a point of connection between the first and the second logic transistors; and
   the driving circuit comprising:
   a first driving transistor of the first conductive type for defining a first logic level; and
   a second driving transistor of the second conductive type for defining a second logic level,
   wherein at least one of the first and the second driving transistors is given an electric voltage different from at least one of the first positive and the first negative voltages; and
   said at least one of the first and the second driving transistors has a threshold level different from that of a same conductive type transistor selected from the first and the second logic transistors,
   wherein the second driving transistor is selected as the at least one of the first and the second driving transistors which is supplied with the electric voltage different from the ground potential.

4. A semiconductor circuit device as claimed in claim 3, wherein the first logic transistor comprises a PMOS transistor supplied with the first positive voltage (Vcc) and the second logic transistor comprises an NMOS transistor given a ground potential as the first negative voltage.

5. A semiconductor circuit device comprising:
   a logic circuit for producing a logical output signal; and
   a driving circuit for driving a signal line in response to the logical output signal,
   wherein the logic circuit is given a first positive voltage and a first negative voltage and includes a first logic transistor of a first conductive type and a second logic transistor of a second conductive type inverse to the first conductive type and connected to the first logic transistor to produce the logical output signal from a point of connection between the first and the second logic transistors; and
   the driving circuit comprising:

a first driving transistor of the first conductive type for defining a first logic level; and a second driving transistor of the second conductive type for defining a second logic level, wherein at least one of the first and the second driving transistors is given an electric voltage different from at least one of the first positive and the first negative voltages; and said at least one of the first and the second driving transistors has a threshold level different from that of a same conductive type transistor selected from the first and the second logic transistors, wherein both the first and the second driving transistors are selected as the at least one of the first and the second driving transistors given source voltages different from the first positive voltage and the first negative voltage, respectively, and having threshold levels different from those of the first and the second logic transistors, respectively.

6. A semiconductor circuit device as claimed in claim 5, wherein the first logic transistor comprises a PMOS transistor supplied with the first positive voltage (Vcc) and the second logic transistor comprises an NMOS transistor given a ground potential as the first negative voltage.

7. A semiconductor circuit device comprising:
a logic circuit which is supplied with a first potential from a positive power supply and with a ground potential from a negative power supply; and
a signal line driving circuit that is supplied from a positive power supply with a second potential lower than the first potential and with a ground potential from a negative power supply;
the signal line driving circuit including:
a PMOS transistor which has a threshold level (represented by an absolute value) lower than that of a PMOS transistor included in the logic circuit and;
an NMOS transistor which has a normal threshold level equivalent with that of an NMOS transistor included in the logic circuit;
the signal line driving circuit buffering an output signal of the logic circuit to send it to a signal line.

8. A semiconductor circuit device as claimed in claim 7, wherein a potential difference between the first potential and the second potential is determined in relation to a threshold difference between the normal threshold level and the lower threshold level and falls within a range from one to ten times of the threshold difference.

9. A semiconductor circuit device comprising:
a logic circuit which is supplied with a first potential from a positive power supply and a ground potential from a negative power supply; and
a signal line driving circuit that is supplied from a positive power supply with the first potential and from a negative power supply with a second potential higher than the ground potential;
the signal line driving circuit including:
an NMOS transistor which has a threshold level lower than that of an NMOS transistor included in the logic circuit; and
a PMOS transistor which has a normal threshold level equivalent with that of a PMOS transistor included in the logic circuit;
the signal line driving circuit buffering an output signal of the logic circuit to send it to a signal line.

10. A semiconductor circuit device as claimed in claim 9, wherein a potential difference between the ground potential and the second potential is determined in relation to a threshold difference between the normal threshold level and the lower threshold level and falls within a range from one to ten times of the threshold potential difference.

11. A semiconductor circuit device comprising:
a logic circuit which is supplied with a first potential from a positive power supply and a ground potential from a negative power supply; and a signal line driving circuit that is supplied from a positive power supply with a second potential lower than the first potential and from a negative power supply with a third potential higher than the ground potential; the signal line driving circuit including: a PMOS transistor which has a threshold level (represented by an absolute value) lower than that of a PMOS transistor included in the logic circuit; and an NMOS transistor which has a threshold level lower than that of an NMOS transistor included in the logic circuit; the signal line driving circuit buffering an output signal of the logic circuit to send it to a signal line.

12. A semiconductor circuit device as claimed in claim 11, wherein a potential difference between the first potential and the second electric potential is determined in relation to a threshold difference between the normal threshold level and the lower threshold level and falls within a range from one to ten times of the threshold potential difference.

13. A semiconductor circuit device as claimed in claim 11, wherein a potential difference between the ground potential and the third potential is determined in relation to a threshold difference between the normal threshold level and the lower threshold level and falls within a range from one to ten times of the threshold difference.

14. A semiconductor circuit device comprising:
a logic circuit which is supplied with a first potential from a positive power supply and a ground potential from a negative power supply; and
a signal line driving circuit that is supplied from a first positive supply with the first potential and from a second positive supply with a second potential lower than the first potential;
the signal line driving circuit comprising:
a first switch element arranged between the first power supply and a first node;
a second switch element arranged between the second power supply and the first node, the first and the second switch elements being complementarily turned on or off;
a capacitor connected to the first node;
a PMOS transistor between the first node and a signal line; and
an NMOS transistor between the signal line and the ground potential;
the first switch element being turned off while the second switch element is turned on when the PMOS transistor is kept in an on-state and the NMOS transistor is kept in an off-state; the first switch element being turned on while the second switch element is turned off when the PMOS transistor is kept in an off-state and the NMOS transistor is kept in an on-state.

15. A semiconductor circuit device as claimed in claim 14, wherein the capacitor has a capacitance determined by multiplying a line capacitance value on the signal line by a value obtained by dividing the second potential by a potential difference between the first and the second electric potentials.

* * * * *